(12) United States Patent
Cho et al.

(10) Patent No.: US 11,054,871 B2
(45) Date of Patent: Jul. 6, 2021

(54) DISPLAY DEVICE INCLUDING RADIANT HEAT BLOCKING LAYER

(71) Applicant: SAMSUNG ELECTRONICS CO., LTD., Suwon-si (KR)

(72) Inventors: Jinhyun Cho, Suwon-si (KR); Jeayou Kim, Suwon-si (KR); Heungbom Kim, Suwon-si (KR); Su-Yoel Ryu, Suwon-si (KR); Seungyong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/833,927

(22) Filed: Mar. 30, 2020

(65) Prior Publication Data
US 2020/0310502 A1    Oct. 1, 2020

(30) Foreign Application Priority Data

Mar. 29, 2019 (KR) ........................ 10-2019-0037180

(51) Int. Cl.
G06F 1/20 (2006.01)
G09F 9/33 (2006.01)
H05K 7/20 (2006.01)

(52) U.S. Cl.
CPC ................. G06F 1/20 (2013.01); G09F 9/33 (2013.01); H05K 7/20954 (2013.01)

(58) Field of Classification Search
CPC .. G06F 1/20; G06F 2200/1612; G06F 1/1637; G06F 1/1601; G09F 9/33; G09F 9/3026; H05K 7/20954
See application file for complete search history.

(56) References Cited

U.S. PATENT DOCUMENTS

| 2005/0140833 | A1* | 6/2005 | Lu | G02F 1/133308 |
| | | | | 349/14 |
| 2007/0285790 | A1 | 12/2007 | Yoon et al. | |
| 2013/0107387 | A1* | 5/2013 | Ju | H01J 11/44 |
| | | | | 359/885 |
| 2016/0247983 | A1* | 8/2016 | Mutschelknaus | H01L 33/62 |
| 2017/0261661 | A1* | 9/2017 | Kiyoto | G02B 5/12 |
| 2018/0356675 | A1* | 12/2018 | Fukasawa | G02B 5/208 |

(Continued)

FOREIGN PATENT DOCUMENTS

| CN | 207148436 U | * | 3/2018 | ............. G02B 27/01 |
| CN | 108803033 A | * | 11/2018 | ......... G02B 27/0025 |
| KR | 20000017060 A | * | 3/2000 | ............. H01J 11/44 |

(Continued)

OTHER PUBLICATIONS

Communication dated Jul. 20, 2020 issued by the International Searching Authority in counterpart Application No. PCT/KR2020/004050.

*Primary Examiner* — Donald L Raleigh
(74) *Attorney, Agent, or Firm* — Sughrue Mion, PLLC

(57) ABSTRACT

A display device, including a display panel configured to display an image in a front direction; an optical layer arranged at a front side of the display panel; and a radiant heat blocking layer arranged at a foremost plane of the display panel, and arranged on a front surface of the optical layer, wherein the radiant heat blocking layer is configured to block radiant heat produced by the display panel or produced behind the display panel from transferring forward from the radiant heat blocking layer.

19 Claims, 8 Drawing Sheets

(56) References Cited

U.S. PATENT DOCUMENTS

2020/0147935 A1 * 5/2020 Patrickson ........ B32B 17/10229

FOREIGN PATENT DOCUMENTS

| KR | 10-2003-0057218 A | 7/2003 |
| KR | 10-2008-0032355 A | 4/2008 |
| KR | 10-2015-0077584 A | 7/2015 |
| KR | 10-2018-0012357 A | 2/2018 |

* cited by examiner

DISPLAY DEVICE INCLUDING RADIANT HEAT BLOCKING LAYER

CROSS-REFERENCE TO RELATED APPLICATION

This application is based on and claims priority under 35 U. S. C. § 119 to Korean Patent Application No. 10-2019-0037180 filed on Mar. 29, 2019, the disclosure of which is incorporated herein by reference in its entirety.

BACKGROUND

1. Field of the Invention

The disclosure relates to a display device, and more particularly, to a display device having improved heat blocking capability.

2. Description of Related Art

Display devices may be a kind of output device for visually presenting data information such as characters, figures, etc., and still or video images.

A display device may include an actively light-emitting display panel such as Organic Light Emitting Diodes (OLEDs) or a passively light-emitting display panel such as Liquid Crystal Displays (LCDs).

Technologies for high brightness and high resolution display devices are being actively developed. To implement high brightness and high resolution, power consumption of the display device may increase. With the increase in power consumption, heat emission of the display device may increase.

The heat produced in the display device may be transferred to a user at a distance from the display device. The heat transfer to the user may make the user feel unpleasant. Hence, the display device may have low competitiveness and further, low reliability.

In particular, considering the recent trend that the display device is ever increasing in size, the large-area display has a problem of an increasing heat emission area.

SUMMARY OF THE INVENTION

Provided is a display device with enhanced radiant heat blocking capability, thereby having improved competitiveness and reliability.

Also provided is a display device including a radiant heat blocking layer to block radiant heat emitted forward from the display device.

Also provided is a display device including a radiant heat blocking layer to transmit or block light depending on the wavelength range.

Additional aspects will be set forth in part in the description which follows and, in part, will be apparent from the description, or may be learned by practice of the presented embodiments.

In accordance with an aspect of the disclosure, a display device includes a display panel configured to display an image in a front direction; an optical layer arranged at a front side of the display panel; and a radiant heat blocking layer arranged at a foremost plane of the display panel, and arranged on a front surface of the optical layer, wherein the radiant heat blocking layer is configured to block radiant heat produced by the display panel or produced behind the display panel from transferring forward from the radiant heat blocking layer.

The radiant heat blocking layer may be configured to transmit light in a first wavelength range, and to block light in a second wavelength range different from the first wavelength range.

The first wavelength range may include wavelengths of about 380 nm to about 780 nm.

The second wavelength range may include wavelengths of about 1000 nm to about 2300 nm.

The radiant heat blocking layer may include silver (Ag).

A thickness of the radiant heat blocking layer may be less than or equal to about 9 nm, and the radiant heat blocking layer may be configured to prevent reduction of a ratio of light transmission in the first wavelength range.

An average ratio of light transmission of the radiant heat blocking layer in the first wavelength range may be at least about 90%.

An average ratio of light reflection of the radiant heat blocking layer in the second wavelength range may be at least about 90%.

The display device may further include an anti-reflection layer arranged at a front side of the radiant heat blocking layer, wherein the anti-reflection layer may be configured to reduce reflection of incident light from outside the display panel.

The anti-reflection layer may be thinner than the radiant heat blocking layer.

The display panel may include a plurality of light emitting diodes (LEDs); a printed circuit board (PCB) on which the plurality of LEDs are mounted; and a protective layer arranged to cover a side of the PCB and all sides of the plurality of LEDs, and configured to protect the plurality of LEDs.

The display panel may include a plurality of light emitting diodes (LEDs); a substrate on which the plurality of LEDS are transferred; a glass plate arranged between the substrate and the optical layer; and a transparent bonding layer configured to bond the substrate to the glass plate and transmit light.

The display panel may include a printed circuit board (PCB); a plurality of LED chips mounted on the PCB, and provided in resin-filled packages; and a glass plate arranged between the PCB and the optical layer.

The display device may further include a backlight unit arranged behind the display panel and configured to emit light.

In accordance with an aspect of the disclosure, a display device includes a substrate on which a plurality of light emitting elements are mounted; a protective layer arranged to cover all sides of the plurality of light emitting elements and configured to protect the plurality of light emitting elements; an optical layer arranged at a front side of the protective layer; and a radiant heat blocking layer arranged at a front side of the optical layer, and configured to contact air outside the display device, wherein the radiant heat blocking layer is configured to block radiant heat produced by the substrate or by the plurality of light emitting elements from transferring forward from the radiant heat blocking layer.

The radiant heat blocking layer may be configured to transmit light in a visible range and to block light in an infrared range.

The radiant heat blocking layer may include silver (Ag), a thickness of the radiant heat blocking layer may be less than or equal to about 9 nm, and the radiant heat blocking layer may be configured to prevent reduction of a ratio of light transmission in a visible range.

An average ratio of light transmission of the radiant heat blocking layer in the visible range may be at least about 90%.

An average ratio of light reflection of the radiant heat blocking layer in the infrared range may be at least about 90%.

The display device may further include an anti-reflection layer arranged at a front side of the radiant heat blocking layer, wherein the anti-reflection layer may be configured to reduce reflection of incident light from the front side of the radiant heat blocking layer.

In accordance with an aspect of the disclosure, a display device includes a substrate; a plurality of light emitting elements mounted on the substrate; a radiant heat blocking layer arranged at a foremost plane of the display device; and an optical layer arranged between the substrate and the radiant heat blocking layer, wherein the radiant heat blocking layer is configured to block radiant heat produced behind the radiant heat blocking layer from transferring forward from the radiant heat blocking layer.

BRIEF DESCRIPTION OF THE DRAWINGS

The above and other objects, features and advantages of certain embodiments of the present disclosure will be more apparent from the following description taken in conjunction with the accompanying drawings, in which.

DETAILED DESCRIPTION OF EXEMPLARY EMBODIMENTS

Embodiments and features as described and illustrated in the disclosure are merely examples, and thus, the inventive concept is not limited to these embodiments disclosed below and may be realized in various other forms.

The terminology used herein is for the purpose of describing particular embodiments and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof. It will be further understood that the terms "block" and/or "blocking", when used in this specification, include the meaning of restricting the temperature rise of the medium by reducing heat transfer from the heat source through the medium.

The terms including ordinal numbers like "first" and "second" may be used to explain various components, but the components are not limited by the terms. The terms are only for the purpose of distinguishing a component from another. Thus, a first element, component, region, layer or chamber discussed below could be termed a second element, component, region, layer or section without departing from the teachings of the disclosure.

Embodiments will now be described with reference to accompanying drawings.

Figure 1:
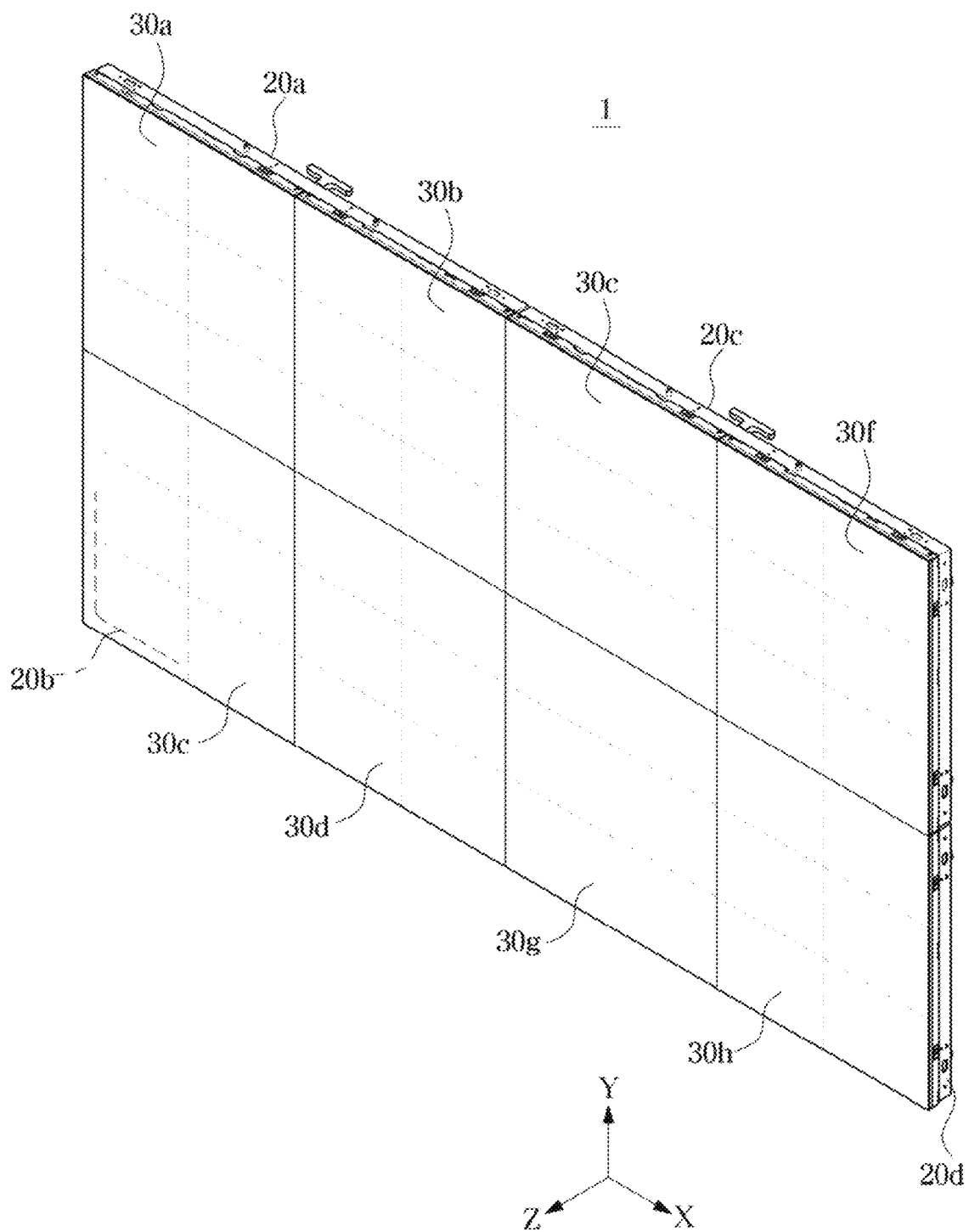
FIG. 1 shows a display device, according to an embodiment.
Figure 2:
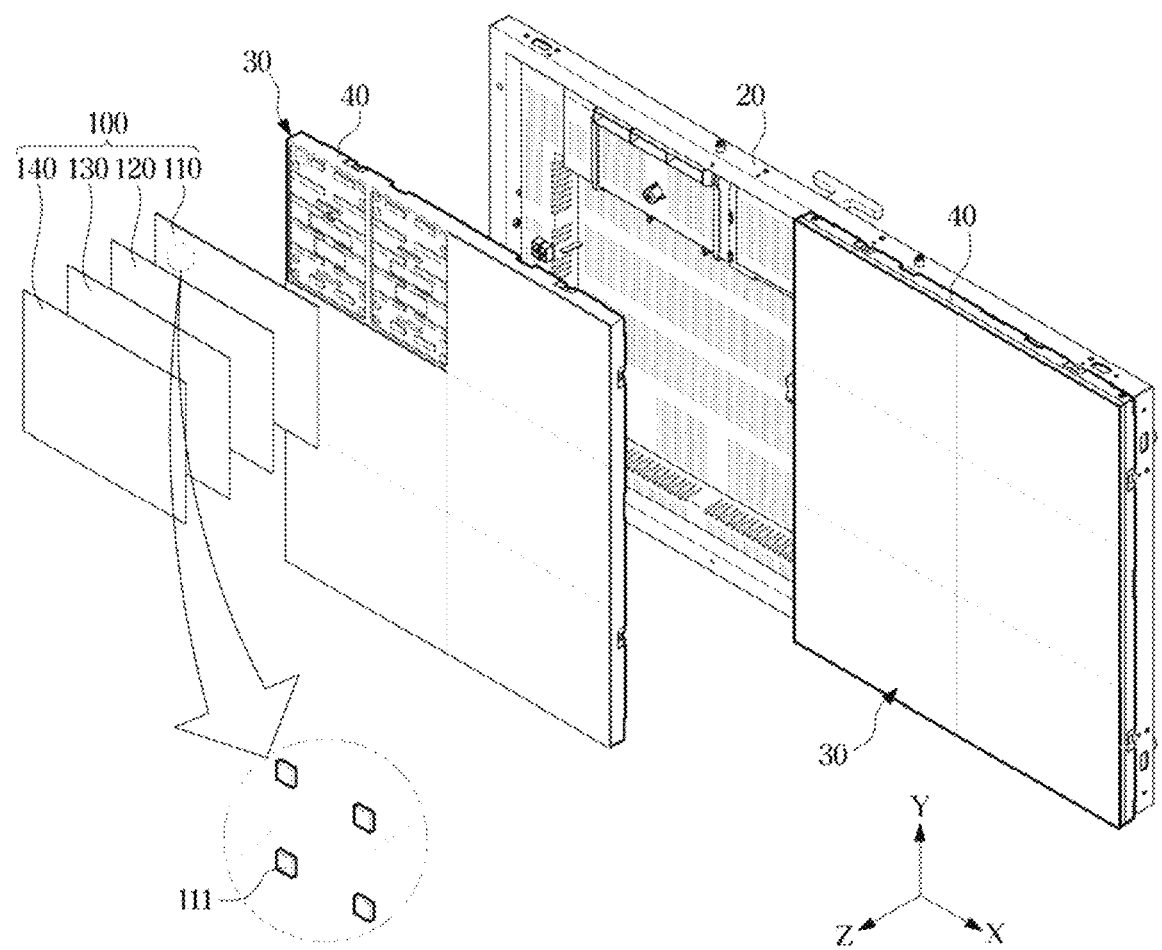
FIG. 2 shows a frame and a display module of a display device, according to an embodiment.
Figure 3:
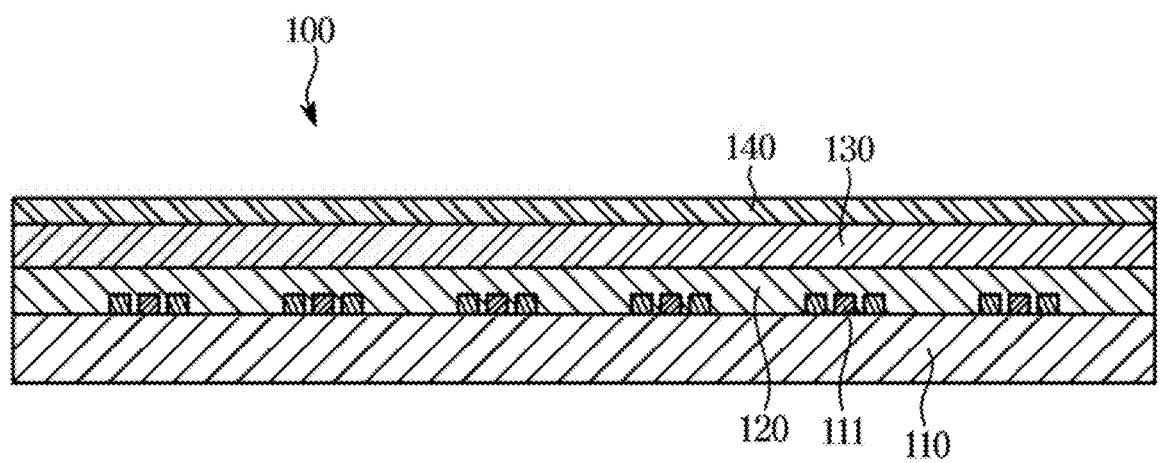
FIG. 3 is a cross-sectional view of a display panel of a display device, according to an embodiment.

FIG. 1 shows a display device, according to an embodiment. FIG. 2 shows a frame and a display module of a display device, according to an embodiment. FIG. 3 is a cross-sectional view of a display panel of a display device, according to an embodiment.

In FIG. 1, an X-axis, Y-axis, and Z-axis perpendicular to one another are shown, where the X-axis represents a left-to-right direction, the Y-axis represents a vertical direction, and the Z-axis represents a front-to-back direction.

An embodiment will now be described with reference to FIGS. 1 to 3. A display device 1 may be a device for displaying information, materials, data, etc., in characters, figures, graphs, images, etc., and may be implemented as an advertising board, an electronic signage, a screen, a television, a monitor, etc. The display device 1 may be installed on a wall or a ceiling, or on an indoor or outdoor ground by means of a stand.

The display device 1 may include a display module 30 for displaying a screen, and a frame 20 coupled to the rear side of the display module 30 for supporting the display module 30.

The display module 30 may include a display panel 100 and a bracket 40 to which the display panel 100 is attached. Although there are 6 display panels 100 attached to one bracket 40 in the illustrated embodiment, there are no limitations on the number of display panels 100 to be attached to the bracket 40. In an embodiment, there may be one or a different number of display panels 100 attached to the one bracket 40. The display panel 100 may be attached onto the front side of the bracket 40 with an adhesive, a double-sided adhesive tape, etc.

The display panel 100 may include a substrate 110, a plurality of light emitting elements 111 mounted on the substrate 110, and a protective layer 120 arranged to protect the light emitting elements 111 or enhance the optical properties. The plurality of light emitting elements 111 may include light emitting diodes (LEDs).

The substrate 110 may include glass, polyimide (PI), FR4, etc. A black layer may be formed on the front side of the substrate 110 to enhance contrast by absorbing outside light.

The plurality of light emitting elements 111 may include red LEDs, green LEDs, and blue LEDs corresponding to sub-pixels. The plurality of light emitting elements 111 are arranged at regular intervals, and the gap between the plurality of light emitting elements 111 may be variously determined depending on the resolution and size of the display device 1. Although the gap between sub-pixels, for example a red LED, a green LED, and a blue LED, and the gap between pixels each including the LEDs are shown as being different in the drawings, the disclosure is not limited thereto. For example, unlike what is shown in the drawings, the gap between sub-pixels may be equal to the gap between pixels. That is, the gap between the plurality of light emitting elements 111 may all be the same.

The protective layer 120 may include a transmissive or fluorescent material, such as acrylic resin, PI resin, epoxy resin, polyurethane resin, etc., to cover the plurality of light emitting elements 111 mounted on the substrate 110. The protective layer 120 may cover a side of the substrate 110 to cover all the sides of the plurality of light emitting elements 111. The side of the substrate 110 covered by the protective layer 120 may correspond to a side on which the plurality of light emitting elements 111 are mounted. However, the embodiment is not limited thereto. In an embodiment, the protective layer 120 may fill the gap between the plurality of light emitting elements 111 and may cover not all the sides of the plurality of light emitting elements 111. That is, the light emitting side of the plurality of light emitting elements 111 may not be covered by the protective layer 120. In other words, the protective layer 120 may cover other sides than the light emitting side of the plurality of light emitting elements 111.

Although the protective layer 120 is shown as if separately provided and glued to the substrate 110 in FIG. 2, in embodiments the protective layer 120 may be formed by being molded on a side of the substrate 110 to cover the plurality of light emitting elements 111.

An optical layer 130 may be arranged on the front of the display panel 100. The optical layer 130 may enhance optical properties of the display panel 100. For example, the optical layer 130 may resolve unevenness of reflecting color or enhance an angle of field.

A radiant heat blocking layer 140 may be arranged at the foremost of the display panel 100. The radiant heat blocking layer 140 may be arranged on the front of the optical layer 130 to define an outermost plane of the display panel 100. Examples of the radiant heat blocking layer 140 will be described below. Throughout the specification, the phrase "define the outermost plane" may be interchangeably used with "be arranged at the foremost".

The radiant heat blocking layer 140 may be an element that affects heat and/or light produced in the display device 1, and which may be arranged at the foremost of the display device 1. When the heat or light produced in the display device 1 is referred to as inside heat or inside light, respectively, the radiant heat blocking layer 140 may be an element to affect the inside heat and/or inside light, and which may be arranged at the foremost of the display device 1.

In an embodiment, the display device 1 may include four frames 20, which may be referred to as frames 20a to 20d, and eight display modules 30, which may be referred to as display modules 30a to 30h. However, there are no limitations on the number of frames or display modules.

The display modules 30 may be arranged by adjoining each other in the vertical direction, for example along the Y-axis, and/or the left-right direction, for example along the X-axis. For example, the display modules 30 may be arranged in the form of an M×N matrix. In an embodiment, the 8 display modules 30 may be arranged in the form of 4×2 matrix.

At least one display module 30 may be coupled to one frame 20. In an embodiment, two display modules 30 may be coupled to one frame 20 in the left-right direction, without being limited thereto.

Figure 4:
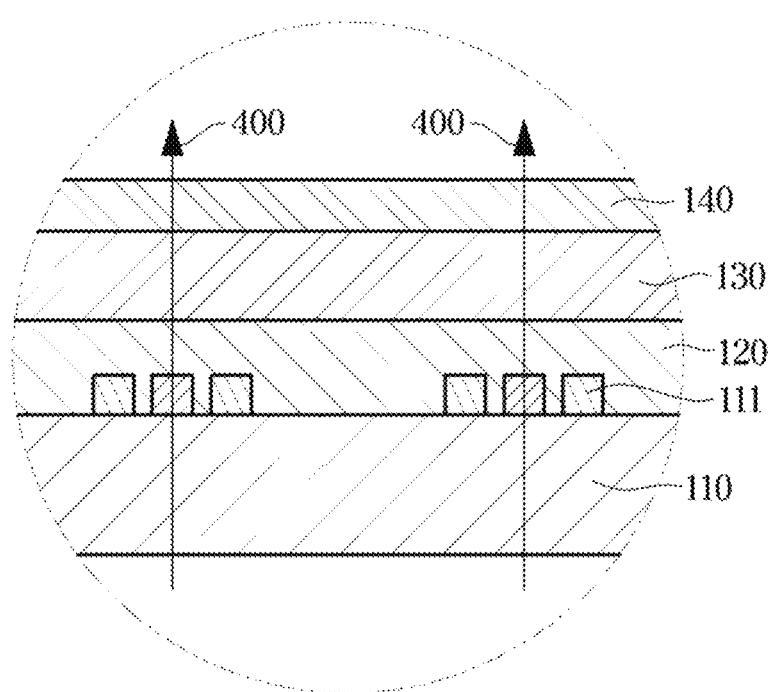
FIG. 4 is an enlarged view of a portion of the display panel shown in FIG. 3, illustrating paths of light in a visible region according to an embodiment.
Figure 5:
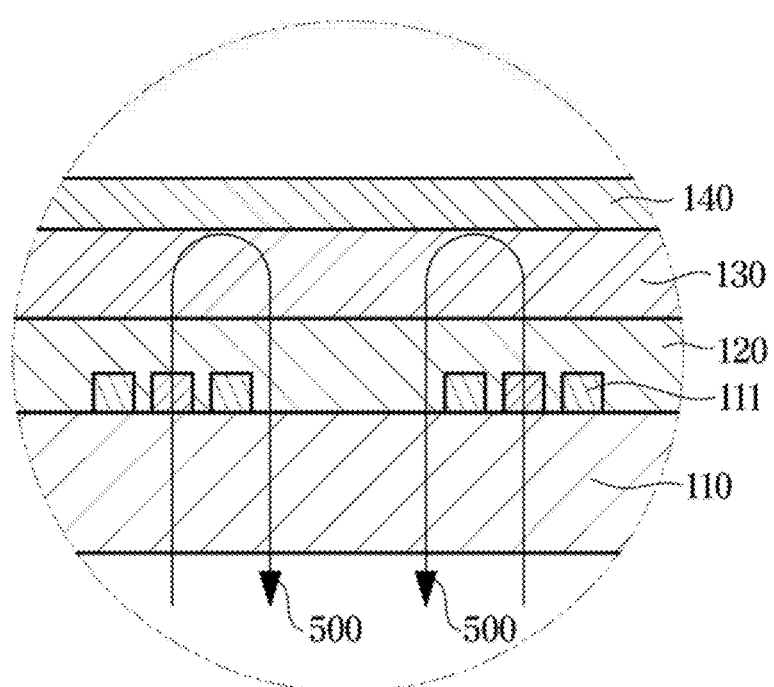
FIG. 5 is an enlarged view of a portion of the display panel shown in FIG. 3, illustrating paths of light in an infrared region according to an embodiment.

FIG. 4 is an enlarged view of a portion of the display panel 100 shown in FIG. 3, illustrating paths of light in a visible region, according to an embodiment. FIG. 5 is an enlarged view of a portion of the display panel shown in FIG. 3, illustrating paths of light in an infrared region, according to an embodiment.

A radiant heat blocking effect of the display device 1 according to an embodiment will now be described in detail in connection with FIGS. 4 and 5.

With implementation of high brightness and/or high resolution of the display, power consumption of the display device may increase. Generally, the power consumption of a display device may be proportional to heat emission of the display device. Accordingly, with the increase in power consumption of the display device 1, the amount of heat produced in the display device 1 may increase and the heat may be emitted to the outside of the display device 1. When the heat is emitted to the outside of the display device 1 and the heat reaches a viewer, the viewer might feel unpleasant. Hence, the display device may have low competitiveness and further, low reliability.

Heat may be transferred in three different ways: conduction, convection, and radiation. In embodiments, the heat in the display device 1 may reach the viewer by radiation. Hence, to block the heat from reaching the viewer due to heat emission from inside the display device, transfer of heat through radiation may be blocked.

Considering a ratio of absorption of light in each wavelength range for elements of the human body, generally the higher the wavelength, the higher the absorption ratio. Specifically, a higher wavelength range than the visible region has a relatively high absorption ratio of light. More specifically, the human body has a high absorption ratio of light in the infrared region, so when a human body is exposed to the light in the infrared region, the human body may feel the radiant heat.

A display device according to embodiments may be implemented to prevent the heat produced in the display device from being transferred by radiation to the viewer located in front of the display device. In other words, the display device according to the embodiments may prevent radiant heat from reaching the viewer by blocking light in a particular wavelength range from being emitted to the outside of the display device. In embodiments, the particular wavelength range may correspond to the infrared region.

The display device may display an image for the viewer. A human body may visually perceive the light in the visible region and may not perceive light in other ranges. Hence, in order for the display device to display an image for the viewer, the light in the visible region should not be blocked from being emitted to the outside of the display device. That is, the light in the visible region may be transmitted.

The display device according to embodiments may not allow the light in the infrared region to be transmitted from the inside of the display device to the outside of the display device, but instead may allow the light in the visible region to be transmitted from the inside of the display device to the outside of the display device. In other words, the display device may block transmission of infrared light, while allowing transmission of visible light.

Referring to FIG. 3, in an embodiment, the display device 1 may include the display panel 100. The display panel 100 may include the substrate 110, the plurality of light emitting elements 111, the protective layer 120 arranged to cover the plurality of light emitting elements 111, and the optical layer 130 arranged on the front of the protective layer 120 to enhance optical properties of light emitted from the plurality of light emitting elements 111, as described above. The display panel 100 may further include the radiant heat blocking layer 140 arranged at the foremost of the display panel 100.

The radiant heat blocking layer 140 may be arranged on the front of the optical layer 130. The radiant heat blocking layer 140 may define an outermost plane of the display device 1. The outermost plane refers to a plane placed on the outermost side when viewed from the front of the display device 1. Accordingly, the radiant heat blocking layer 140 may contact the optical layer 130 on one side and may contact outside air on the other side.

The radiant heat blocking layer 140 may selectively transmit light. The radiant heat blocking layer 140 may transmit light in a first wavelength range. The radiant heat blocking layer 140 may block light in a second wavelength range which is different from the first wavelength range. That is, the radiant heat blocking layer 140 may not transmit light in the second wavelength range. The first wavelength range may correspond to the visible region, and the second wavelength range may correspond to the infrared region. The first wavelength range may be numerically expressed as being from about 380 nm to about 780 nm. The second wavelength range may be from about 1000 nm to about 2300 nm.

Referring to FIG. 4, the visible light 400, which may be light in the visible region, may pass the radiant heat blocking layer 140. Specifically, most of the visible light 400 may pass the radiant heat blocking layer 140. As to a path of the visible light 400, it may be seen in FIG. 4 that the visible light 400 passes the display panel 100 from rear to front. Light produced from light sources, for example the plurality of light emitting elements 111, may pass through the protective layer 120, the optical layer 130, and the radiant heat blocking layer 140 and reach the viewer. The viewer may then visually perceive an image displayed on the display panel 100.

Referring to FIG. 5, the infrared light 500, which may be light in the infrared region, may not penetrate the radiant heat blocking layer 140. Specifically, most of the infrared light 500 may not penetrate but may reflect off the radiant heat blocking layer 140. A path of infrared light 500 will now be described. The infrared light 500 may penetrate the substrate 110, the plurality of light emitting elements 111, the protective layer 120, and the optical layer 130 from the back of the display panel 100, but may not penetrate and therefore may reflect off the radiant heat blocking layer 140 to the back of the display panel 100. This may reduce the amount of heat produced from the display panel 100 or from the back of the display panel 100 that reaches the viewer by radiation.

As described above, the radiant heat blocking layer 140 may be formed to transmit the visible light 400 but block the infrared light 500. To have this property, the radiant heat blocking layer 140 may be formed with silver Ag. Silver Ag has a physical property to reflect light of a particular wavelength or higher. Silver Ag typically reflects light of about 500 nm or higher. In other words, the light of about 500 nm or higher does not penetrate, but instead reflects off of, a layer formed with silver Ag. In the embodiment, however, an additional measure may be used to transmit light in a wavelength range of about 380 nm to about 780 nm.

In order for the radiant heat blocking layer 140 formed with silver Ag to transmit light in the visible region, the radiant heat blocking layer 140 may be formed to be about 9 nm or less thick. Otherwise, when the thickness of the radiant heat blocking layer 140 is greater than about 9 nm, even the light in the visible region may be significantly blocked in the radiant heat blocking layer 140 due to the physical property of silver Ag. In an embodiment, to enable the light in the visible region to pass the radiant heat blocking layer 140, the radiant heat blocking layer 140 may have thickness of about 9 nm or less.

As described above, the radiant heat blocking layer 140 may define an outermost plane of the display panel 100 or the display device 1. An example of a reason for defining the outermost plane of the display panel 100 or the display device 1 will now be described.

The radiant heat blocking layer 140 may transmit the light in the visible region but block the light in the infrared region by reflecting the light. This may prevent radiant heat from behind the radiant heat blocking layer 140 from being transferred forward from the radiant heat blocking layer 140. However, temperature itself on the surface of the radiant heat blocking layer 140 may rise.

The optical layer 130 may have a certain heat capacity. When the optical layer 130 receives heat that exceeds the heat capacity, the optical layer 130 may emit heat by means of radiation. In this case, an amount of the radiant heat emitted by the optical layer 130 may be proportional to the heat capacity of the optical layer 130. Furthermore, the heat capacity of the optical layer 130 may be proportional to the volume of the optical layer 130. The optical layer 130 may be provided to cover the entire display panel 100, so the area of the optical layer 130 may substantially correspond to the area of the display panel 100. Accordingly, the volume and heat capacity of the optical layer 130 may be determined depending on the thickness of the optical layer 130. The thickness of the optical layer 130 may be commonly set on the micrometer scale. The optical layer 130 formed on the micrometer scale may have a relatively high heat capacity. When the optical layer 130 is arranged on the outermost plane of the display device 1, the influence of the radiant heat blocking layer 140, even arranged on the back of the optical layer 130, may be reduced because of a large amount of radiant heat emitted by the optical layer 130.

Therefore, the radiant heat blocking layer 140 may be arranged on the outermost plane of the display device 1 to prevent the radiant heat emitted from the optical layer 130 from being emitted forward from the display device 1.

In embodiments, the radiant heat blocking layer 140 in an embodiment may transmit, for example, 90% or more of light in the visible region. In the visible region, an average ratio of light transmission of the radiant heat blocking layer 140 may be, for example, about 90% or higher. Furthermore, the radiant heat blocking layer 140 may reflect, for example, about 90% or more of light in the infrared region. In the infrared region, an average ratio of light reflection of the radiant heat blocking layer 140 may be, for example, about 90% or higher.

Figure 6:
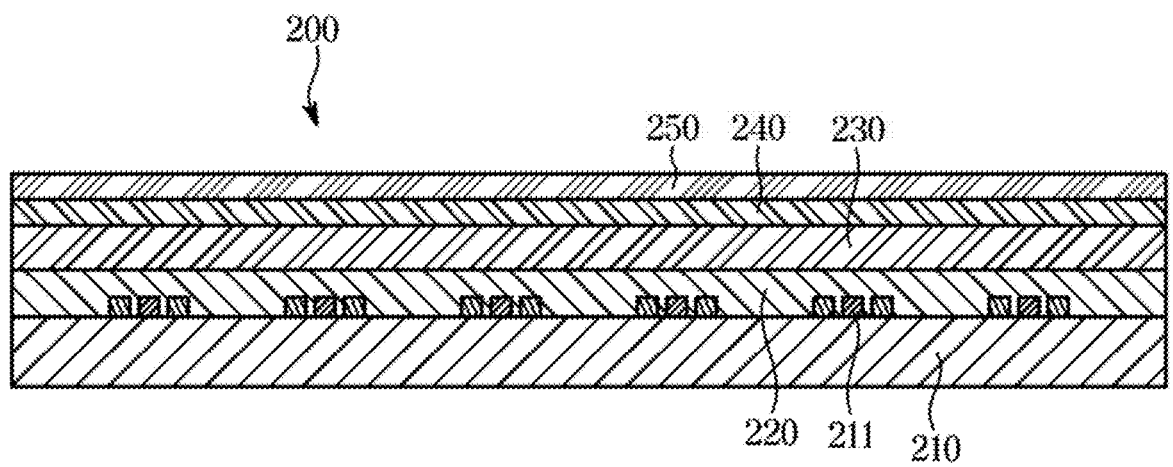
FIG. 6 is a cross-sectional view of a display panel of a display device, according to an embodiment.

FIG. 6 is a cross-sectional view of a display panel of a display device, according to an embodiment. Description overlapping with the foregoing will not be repeated.

Referring to FIG. 6, in a display device according to an embodiment, a display panel 200 may include a substrate 210, a plurality of light emitting elements 211, a protective layer 220 for covering and protecting the plurality of light emitting elements 211, an optical layer 230 to enhance optical properties of light emitted from the plurality of light emitting elements 211, and a radiant heat blocking layer 240. The display panel 200 may further include an anti-reflection layer 250 arranged on the front of the radiant heat blocking layer 240.

The anti-reflection layer 250 may be arranged on the front of the radiant heat blocking layer 240, thereby defining an outermost plane of the display device. The outermost plane may correspond to the foremost plane.

The anti-reflection layer 250 may be arranged at the foremost as an element to affect light incident onto and/or heat transferred to the display device from outside the display device. The light incident onto the display device from outside the display device may be referred to as outside light, and the heat transferred to the display device from outside the display device may be referred to as outside heat. The anti-reflection layer 250 may be arranged at the foremost of the display device as an element to affect the outside heat and/or outside light.

As described above, the radiant heat blocking layer 240 may be arranged at the foremost of the display device or the display panel 200. However, when the radiant heat blocking layer 240 is arranged on the foremost of the display panel 200, the outside light may reflect off the radiant heat blocking layer 240 because the radiant heat blocking layer 240 is made of metal. In an embodiment, the display panel 200 may further include the anti-reflection layer 250 arranged on the front of the radiant heat blocking layer 240 to reduce the outside light reflection.

The anti-reflection layer 250 may be formed to reduce reflection of the incident light from outside the display panel 200. The anti-reflection layer 250 may reduce reflection of the outside light that occurs at the radiant heat blocking layer 240. The anti-reflection layer 250 may refer to an anti-reflection (AR) film.

The thickness of the anti-reflection layer 250 may be set on the nanometer scale. For example, the anti-reflection layer 250 may be about 100 nm thick. However, this is an example, and in embodiments the anti-reflection layer 250 may be thinner than the radiant heat blocking layer 240. The anti-reflection layer 250 may be formed to be as thin as possible to maximize the radiant heat blocking performance of the radiant heat blocking layer 240.

The anti-reflection layer 250 may emit radiant heat in proportion to heat capacity as in the optical layer 230. Accordingly, the radiant heat emitted from the anti-reflection layer 250 may be reduced by reducing heat capacity of the anti-reflection layer 250. The anti-reflection layer 250 may have substantially the same area as that of the display panel 200, so the heat capacity of the anti-reflection layer 250 may be reduced by reducing the height, or thickness, of the anti-reflection layer 250.

The anti-reflection layer 250 may have thickness on the nanometer scale, and thus emit much less amount of radiant heat than in the case that the optical layer 230 having thickness on the micrometer scale is arranged at the foremost of the display panel 200. Accordingly, to block emission of the radiant heat, the radiant heat blocking layer 240 may be arranged at the foremost of the display panel 200, but the anti-reflection layer 250 having thickness on the nanometer scale may not significantly affect the amount of emission of the radiant heat even when arranged in front of the radiant heat blocking layer 240. The anti-reflection layer 250 may reduce reflection of the outside light while not practically interfering with blocking of emission of the radiant heat.

Figure 7:
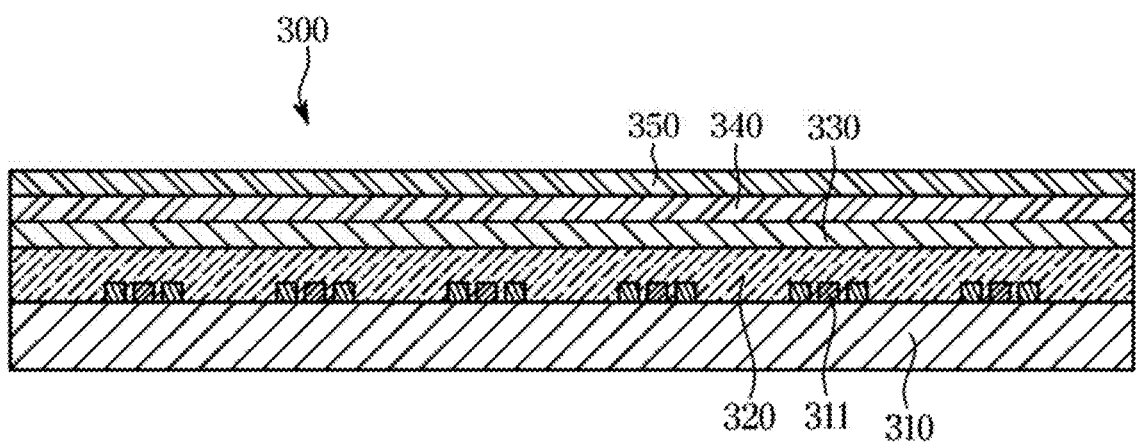
FIG. 7 is a cross-sectional view of a display panel of a display device, according to an embodiment.

FIG. 7 is a cross-sectional view of a display panel of a display device, according to an embodiment.

Referring to FIG. 7, in a display device according to an embodiment, a display panel 300 may include micro light emitting diodes (LEDs) as a plurality of light emitting elements 311.

The plurality of light emitting elements 311 may be formed with an inorganic material, and may include micro LEDs each having a size of a few to hundreds of micrometers (μm) in each of the length and the width. The plurality of light emitting elements 311 may be picked up from a silicon wafer and transferred directly onto a substrate 310. The substrate 310 may include a thin film transistor (TFT).

The display panel 300 may include a glass plate 330 arranged in front of the substrate 310, and a transparent bonding layer 320 arranged to bond the substrate 310 and the glass plate 330 and still transmit light. The transparent bonding layer 320 may include an optically clear adhesive (OCA).

An optical layer 340 may be arranged in front of the glass plate 330, and a radiant heat blocking layer 350 may be arranged in front of the optical layer 340. As described above, the radiant heat blocking layer 350 may be arranged on the outermost plane of the display panel 300. In embodiments, an anti-reflection layer may be arranged on the front of the radiant heat blocking layer 350 to reduce reflection of outside light.

Figure 8:
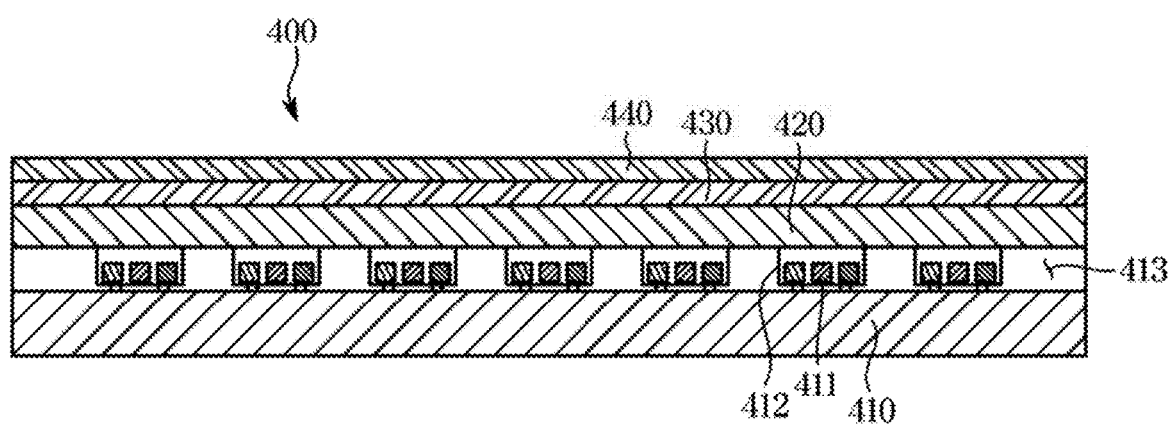
FIG. 8 is a cross-sectional view of a display panel of a display device, according to an embodiment.

FIG. 8 is a cross-sectional view of a display panel of a display device, according to an embodiment.

Referring to FIG. 8, in a display device according to an embodiment, a display panel 400 may include a plurality of light emitting elements 411 and a printed circuit board (PCB) 410 on which the plurality of light emitting elements 411 are mounted. The plurality of light emitting elements 411 may be arranged in resin-filled packages. The plurality of light emitting elements 411 may be mounted on the PCB 410, with each package 412 having a red LED, a green LED, and a blue LED. The packages 412 may be mounted on the PCB 410 by soldering.

The display panel 400 may further include a glass plate 420 arranged in front of the plurality of light emitting elements 411 and the PCB 410. The glass plate 420 may be arranged in front of the packages 412 including the plurality of light emitting elements 411. The glass plate 420 may be bonded onto the front of the packages 412 with an adhesive, a double-sided adhesive tape, etc. There are no limitations on how to bond the glass plate 420, and there may be various bonding methods. An air layer 413 may be formed between the glass plate 420 and the PCB 410.

An optical layer 430 may be arranged in front of the glass plate 420, and a radiant heat blocking layer 440 may be arranged in front of the optical layer 430. As described above, the radiant heat blocking layer 440 may be arranged on the outermost plane of the display panel 400. In embodiments, an anti-reflection layer may be arranged on the front of the radiant heat blocking layer 440 to reduce reflection of outside light.

In embodiments, the radiant heat blocking layer may also be applicable to a display device including a backlight unit. There are no limitations on the type of backlight unit, and thus, the radiant heat blocking layer according to the embodiments may be applicable to a display device including a direct type backlight unit and a display device including an edge type backlight unit. For example, the radiant heat blocking layer of the disclosure may be applicable even to a display device including a light emitting/receiving display panel. In embodiments, the anti-reflection layer may also be applicable along with the radiant heat blocking layer.

According to an embodiment, a display device may be provided with enhanced radiant heat blocking capability, thereby having improved competitiveness and reliability.

According to an embodiment, a display device including a radiant heat blocking layer to block radiant heat emitted forward from the display device may be provided.

According to an embodiment, a display device including a radiant heat blocking layer to transmit or block light depending on the wavelength range may be provided.

According to the embodiments, high temperature radiant heat produced by implementation of a high brightness and high resolution display may be blocked from being emitted toward a viewer from the display device.

Several embodiments have been described above, but a person of ordinary skill in the art will understand and appreciate that various modifications can be made without departing the scope defined by the following claims.

What is claimed is:

1. A display device, comprising:
   a display panel configured to display an image in a front direction;
   an optical layer arranged at a front side of the display panel; and
   a radiant heat blocking layer arranged at a foremost plane of the display panel, and arranged on a front surface of the optical layer,
   wherein the radiant heat blocking layer is configured to block radiant heat produced by the display panel or produced behind the display panel from transferring forward from the radiant heat blocking layer, and
   wherein the display panel comprises:
      a plurality of light emitting diodes (LEDs);
      a substrate on which the plurality of LEDS are transferred; and
      a glass plate arranged between the substrate and the optical layer.

2. The display device of claim 1, wherein the radiant heat blocking layer is configured to transmit light in a first wavelength range, and to block light in a second wavelength range different from the first wavelength range.

3. The display device of claim 2, wherein the first wavelength range includes wavelengths of about 380 nm to about 780 nm.

4. The display device of claim 2, wherein the second wavelength range includes wavelengths of about 1000 nm to about 2300 nm.

5. The display device of claim 1, wherein the radiant heat blocking layer comprises silver (Ag).

6. The display device of claim 2, wherein a thickness of the radiant heat blocking layer is less than or equal to about 9 nm, and
   wherein the radiant heat blocking layer is configured to prevent reduction of a ratio of light transmission in the first wavelength range.

7. The display device of claim 3, wherein an average ratio of light transmission of the radiant heat blocking layer in the first wavelength range is at least about 90%.

8. The display device of claim 4, wherein an average ratio of light reflection of the radiant heat blocking layer in the second wavelength range is at least about 90%.

9. The display device of claim 1, further comprising an anti-reflection layer arranged at a front side of the radiant heat blocking layer,
   wherein the anti-reflection layer is configured to reduce reflection of incident light from outside the display panel.

10. The display device of claim 9, wherein the anti-reflection layer is thinner than the radiant heat blocking layer.

11. The display device of claim 1, wherein the substrate comprises a printed circuit board (PCB) on which the plurality of LEDs are mounted; and
   wherein the display panel further comprises a protective layer arranged to cover a side of the PCB and surround the LEDs, and configured to protect the plurality of LEDs.

12. The display device of claim 1, wherein the display panel
   further comprises a transparent bonding layer configured to bond the substrate to the glass plate and transmit light.

13. A display device, comprising:
   a display panel configured to display an image in a front direction;
   am optical layer arranged at a front side of the display panel; and
   a radiant heat blocking layer arranged at a foremost plane of the display panel, and arranged on a front surface of the optical layer,
   wherein the radiant heat blocking layer is configured to block radiant heat produced by the display panel or produced behind the display panel from transferring forward from the radiant heat blocking layer, and
   wherein the display panel comprises
      a printed circuit board (PCB);
      a plurality of LED chips mounted on the PCB, and provided in resin-filled packages; and
      a glass plate arranged between the PCB and the optical layer.

14. The display device of claim 1, further comprising a backlight unit arranged behind the display panel and configured to emit light.

15. A display device, comprising:
   a substrate on which a plurality of light emitting elements are mounted;
   a protective layer arranged to cover all sides of the plurality of light emitting elements and configured to protect the plurality of light emitting elements;
   an optical layer arranged at a front side of the protective layer;
   a glass plate arranged between the substrate and the optical layer; and
   a radiant heat blocking layer arranged at a front side of the optical layer, and configured to contact air outside the display device,
   wherein the radiant heat blocking layer is configured to block radiant heat produced by the substrate or by the plurality of light emitting elements from transferring forward from the radiant heat blocking layer.

16. The display device of claim 15, wherein the radiant heat blocking layer is configured to transmit light in a visible range and to block light in an infrared range.

17. The display device of claim 15, wherein the radiant heat blocking layer includes silver (Ag),
   wherein a thickness of the radiant heat blocking layer is less than or equal to about 9 nm, and
   wherein the radiant heat blocking layer is configured to prevent reduction of a ratio of light transmission in a visible range.

18. The display device of claim 15, further comprising an anti-reflection layer arranged at a front side of the radiant heat blocking layer,
   wherein the anti-reflection layer is configured to reduce reflection of incident light from the front side of the radiant heat blocking layer.

19. A display device, comprising:
   a substrate;
   a plurality of light emitting elements mounted on the substrate;
   a radiant heat blocking layer arranged at a foremost plane of the display device;
   an optical layer arranged between the substrate and the radiant heat blocking layer; and a glass plate arranged between the substrate and the optical layer,
wherein the radiant heat blocking layer is configured to block radiant heat produced behind the radiant heat blocking layer from transferring forward from the radiant heat blocking layer.

* * * * *